(12) United States Patent
Kaukovuori et al.

(10) Patent No.: US 9,306,513 B2
(45) Date of Patent: Apr. 5, 2016

(54) APPARATUS FOR A RADIO FREQUENCY INTEGRATED CIRCUIT

(71) Applicant: Broadcom Corporation, Irvine, CA (US)

(72) Inventors: Jouni Kristian Kaukovuori, Vantaa (FI); Jonne Riekki, Espoo (FI); Jari Heikkinen, Helsinki (FI)

(73) Assignee: BROADCOM CORPORATION, Irvine, CA (US)

( * ) Notice: Subject to any disclaimer, the term of this patent is extended or adjusted under 35 U.S.C. 154(b) by 53 days.

(21) Appl. No.: 14/155,622

(22) Filed: Jan. 15, 2014

(65) Prior Publication Data

US 2014/0225675 A1  Aug. 14, 2014

(30) Foreign Application Priority Data

Jan. 15, 2013  (GB) .................................. 1300700.0

(51) Int. Cl.
*H03F 3/04* (2006.01)
*H03F 3/68* (2006.01)
(Continued)

(52) U.S. Cl.
CPC .............. *H03F 3/193* (2013.01); *H03F 1/0277* (2013.01); *H03F 1/223* (2013.01); *H03F 3/195* (2013.01); *H03F 3/24* (2013.01); *H03F 3/45183* (2013.01); *H03F 3/72* (2013.01); *H04B 1/006* (2013.01); *H04B 1/0057* (2013.01); *H04B 1/48* (2013.01); *H03F 3/68* (2013.01); *H03F 2200/06* (2013.01); *H03F 2200/09* (2013.01); *H03F 2200/111* (2013.01); *H03F 2200/294* (2013.01); *H03F 2200/372* (2013.01); *H03F 2200/429* (2013.01); *H03F 2200/451* (2013.01); *H03F 2203/45352* (2013.01); *H03F 2203/45394* (2013.01);
(Continued)

(58) Field of Classification Search
CPC ......... H03F 3/72; H03F 1/0277; H03F 3/193; H03F 2200/294; H03F 2200/451; H03F 3/195; H03F 3/68; H03F 1/26; H03F 1/32; H03F 2200/06; H03F 2200/09; H03F 2203/7206; H03F 2203/7209; H03F 2203/7215; H03F 2200/429; H03F 3/45183; H03F 1/223; H03F 3/24; H03F 3/07
USPC .................................. 330/126, 253, 301, 307
See application file for complete search history.

(56) References Cited

U.S. PATENT DOCUMENTS 4,264,872 A * 4/1981 Suzuki ........................... 330/253
7,746,169 B2 * 6/2010 Deng et al. ..................... 330/254
(Continued)

FOREIGN PATENT DOCUMENTS

WO  2008039503  4/2008

*Primary Examiner* — Khanh V Nguyen
(74) *Attorney, Agent, or Firm* — Oblon, McClelland, Maier & Neustadt, L.L.P.

(57) ABSTRACT

A low noise amplifier for radio frequency integrated circuits having an adaptive input and operating mode selection. The low noise amplifier comprises two inputs which can be operated in different configurations. The operating mode may be chosen in such way that the inputs are used respectively one at the time for single-ended configuration or both inputs are used for differential configuration. Additionally, in single-ended operation, inputs can be matched to different frequencies. The information regarding the operating mode is obtained from an external component. The operating mode to be used may be determined when the device using a particular radio frequency integrated circuit is designed or it can be determined dynamically by the device using the radio frequency integrated circuit.

19 Claims, 16 Drawing Sheets

(51) Int. Cl.
  *H03F 3/193* (2006.01)
  *H03F 3/195* (2006.01)
  *H03F 3/72* (2006.01)
  *H04B 1/00* (2006.01)
  *H04B 1/48* (2006.01)
  *H03F 1/02* (2006.01)
  *H03F 1/22* (2006.01)
  *H03F 3/24* (2006.01)
  *H03F 3/45* (2006.01)

(52) U.S. Cl.
  CPC ............. *H03F2203/45544* (2013.01); *H03F 2203/45554* (2013.01); *H03F 2203/45631* (2013.01); *H03F 2203/45638* (2013.01); *H03F 2203/45644* (2013.01); *H03F 2203/45731* (2013.01); *H03F 2203/7206* (2013.01); *H03F 2203/7209* (2013.01); *H03F 2203/7215* (2013.01); *H03F 2203/7236* (2013.01)

(56) References Cited

U.S. PATENT DOCUMENTS

| 8,482,348 B2 * | 7/2013 | Pinarello et al. ............... 330/51 |
| 2010/0182089 A1 | 7/2010 | Zolfaghari |
| 2012/0231752 A1 | 9/2012 | Roufoogaran et al. |

* cited by examiner

APPARATUS FOR A RADIO FREQUENCY INTEGRATED CIRCUIT

CROSS REFERENCE TO A RELATED APPLICATION

This application claims the benefit under 35 U.S.C. §119 (a) and 37 CFR §1.55 to UK patent application no. 1300700.0 filed on, 15 Jan. 2013, the entire content of which is incorporated herein by reference.

TECHNICAL FIELD

The present invention relates to an apparatus for a radio frequency integrated circuit. Some embodiments of the invention relate to amplifiers, in particular but not exclusively, low noise amplifiers and the use of low noise amplifiers in radio frequency integrated circuits and devices using such radio frequency integrated circuits.

BACKGROUND

A low noise amplifier (LNA) is an electronic amplifier used to amplify weak signals that are, for example, captured by an antenna of a radio communication device, such as a mobile phone. A low noise amplifier is an essential component in a Radio Frequency Integrated Circuit (RFIC), wherein it is typically the first amplifying block. Therefore, in addition to the targeted gain, noise and linearity performances, it should provide sufficient input matching to provide termination impedance for preceding blocks like RF/duplex filters. To be able to support an adequate number of radio frequency bands or just shortly bands, within a single RF-platform, several low noise amplifiers are needed. Depending on the operating mode, each low noise amplifier requires one or two receiver pins. The expression operating mode means in this application the operating configuration regarding receiving pins, wherein one or two pins can be used or both pins can be turned off. In addition to requirements mentioned above there may be additional requirements, such as a need for a Diversity receiver, which mandates even more receiver pins.

The target is to keep the number of pins as small as possible due to several obvious reasons. The RFIC should be as small as possible, and the design can then be pin or connection pad count limited, i.e. although the separation of connection pads is kept small, there is a limit for the maximum number of pins that the RFIC can conveniently support without compromising installation reliability. In the future, the pad count limitation might become a bottleneck, for example due to carrier aggregation that can increase the number of RF inputs, interface and control pins required. Also, when the number of RF pins is large, the routing on printed wiring board (PWB) and redistribution (RDL) layers becomes troublesome. Therefore, there might be certain inputs where the performance is traded off with cumbersome and longish signal routing paths. The situation described above is illustrated in FIG. 1.

To mitigate the input pin count problem, the recent trend has been towards single-ended receiver pins and low noise amplifiers. The single-ended (SE) low noise amplifier topology clearly requires less input pins than the differential one. The drawback is the sensitivity to interference; the balanced/differential structure senses the same common-mode interference in both branches, which is then reduced in the low noise amplifier output, and the interference can be tolerated. In the single-ended case, the interference cannot be separated from the wanted signal, and desensitization can happen. However, single-ended low noise amplifiers typically have a better dynamic range in same operating conditions. Therefore, there is a trade-off between the performance and the number of input pins required when choosing the configuration for the low noise amplifier. Therefore, in the beginning of the RFIC program, a selection between single-ended/differential low noise amplifiers has to be made. It is difficult to change the topology after the first engineering samples have been manufactured.

In FIGS. 2a-2f, examples of single-ended low noise amplifier topologies are illustrated. In addition, any single-ended low noise amplifier topology can be duplicated and thus modified into a differential one. In cellular products, low noise amplifiers are seldom truly single-ended but comprise either a passive or active balun. Conversion from single-ended to differential can be done after the low noise amplifier as well, but at some stage before the down-conversion mixer. The receiver front-end shall comprise a differential signal path, since typically a double-balanced mixer structure (both differential RF and LO ports) offers adequate performance for cellular products. In the figures, the following topologies are shown as examples. In FIG. 2a, a balun is included in the low noise amplifier input. In FIG. 2b, a balun is at the LNA output (load). In FIG. 2c, a signal is taken from a source, and drain nodes have a 180 degrees phase shift. In FIG. 2d, the voltage signal after the first common-source (CS) stage ($M_{INA}$) is sensed with $M_{INB}$. The balanced signal is (coarsely) achieved since the common-source stage turns the phase by 180 degrees. FIG. 2e discloses a topology with a balanced signal path created with a combination of common-source and common-gate stages. In FIG. 2f, the gate of $M_{IN,CG}$ is alternatively connected to the output of the CS stage (drain of $M_{CS}$).

Thus, the problem of the prior art is how to maintain the same performance with a reduced number of pins required. The problems in a large number of pins include, for example, increase in space requirement, manufacturing costs and inflexibility in design.

SUMMARY

There is described a low noise amplifier for radio frequency integrated circuits having an adaptive input and operating mode selection. The low noise amplifier comprises two inputs which can be operated in different configurations. Additionally, in a single-ended operating mode, inputs can be matched to different frequencies. The operating mode may be chosen from a set of operating modes that comprises at least three operating modes, wherein the inputs are used one at the time for single-ended configuration or both inputs are used for differential configuration. The operating mode may be indicated by, for example, a pin configured to receive a control signal, a memory location, for example a register, configured to store the operating mode or any other suitable indicator. The operating mode to be used may be determined when the device using a particular radio frequency integrated circuit is designed or it can be determined dynamically by the device using the radio frequency integrated circuit. Furthermore, when a low noise amplifier is not in use, both inputs may be turned off.

In an embodiment of the invention, the invention is implemented as an apparatus for radio frequency integrated circuit. The embodiment comprises means for receiving a first input signal, means for receiving a second input signal and means for indicating an operating mode. The embodiment is operated in accordance with the operating mode such that the operating mode is selected from a set of operating modes that comprises at least three following operating modes and is selected in accordance with said means for indicating the operating mode: the means for receiving a first input signal is active in a single-ended mode configured to receive a first radio frequency band from said first input, the means for receiving a second input signal is active in a single-ended mode configured to receive a second radio frequency band from said second input, or the means for receiving first and second input signals is active in a differential mode configured to receive a radio frequency band from said first and second input.

In a further embodiment of the invention, the invention is implemented as an apparatus comprising a first input and a second input, and the apparatus is operated so that the operating mode is one of the following in accordance with said operating mode: the first input is active in a single-ended mode configured to receive a first radio frequency band from said first input, the second input is active in a single-ended mode configured to receive a second radio frequency band from said second input, or first and second inputs are active in a differential mode configured to receive a radio frequency band from said first and second input.

In a further embodiment of the invention, the invention is implemented as an apparatus for a radio frequency integrated circuit the apparatus comprising: means for receiving a first input signal; means for receiving a second input signal; means for indicating an operating mode; wherein the apparatus comprises an adaptive operating mode selected from a set of operating modes, wherein said set comprises at least the following: means for receiving the first input signal is active in a single-ended mode configured to receive a first radio frequency band from said first input; means for receiving the second input signal is active in a single-ended mode configured to receive a second radio frequency band from said second input; means for receiving first and second input signals are active in a differential mode configured to receive a radio frequency band from said first and second input.

The apparatus of this embodiment may comprise first and second means for activating a connection to said means for receiving the first and second input signals, respectively, and configured to create an active balun in accordance with said means for indicating the operating mode.

The apparatus of this embodiment may further comprise a first and a second capacitor, wherein said first capacitor is connected between said first means for receiving the input signal and said first means for activating a connection and said second capacitor is connected between said second means for receiving the input signal and said second means for activating connection.

In this embodiment each of the means for receiving the input signal and means for activating may be connected to means for matching impedance towards a low-impedance node.

In this embodiment said low-impedance node may comprise a ground or a supply voltage.

In this embodiment said first means for receiving the input signal and said second means for activating are connected to first common means for matching impedance and said second means for receiving the input signal and said first means for activating are connected to second common means for matching impedance.

In this embodiment the apparatus may further comprise means for degenerating, wherein said first means for receiving the input signal and said second means for activating are connected to a first input of said means for degenerating and said second means for receiving the input signal and said first means for activating are connected to said means for degenerating.

In this embodiment the apparatus may further comprise first and second means for degenerating, wherein said first means for receiving the input signal and said second means for activating are connected to said first means for degenerating and said second means for receiving the input signal and said first means for activating are said second means for degenerating.

In a further embodiment of the invention, the invention is implemented as a method. In the method, an input signal for amplification according to an operating mode is first received. The input signal of a first radio frequency band is received from a first input in a single-ended mode; or the input signal of a second radio frequency band is received from a second input in a single-ended mode; or the input signal is received from first and second inputs in a differential mode. Then, said received signal is amplified, and the amplified signal is provided to an output.

With adaptive mode selection between single-ended and differential modes, the performance and the number of supported pins can be optimized upon customers' needs. Furthermore, pin adaptation can yield additional optimization with printed wiring board routings and the front-end module. Furthermore, the radio frequency integrated circuit product life time can be extended due to flexible support for a variety of products. Because of the flexibility, there is no need to design a new integrated circuit. As the changes in integrated circuits are costly, significant cost savings can be achieved when the integrated circuit can be used in a plurality of products.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
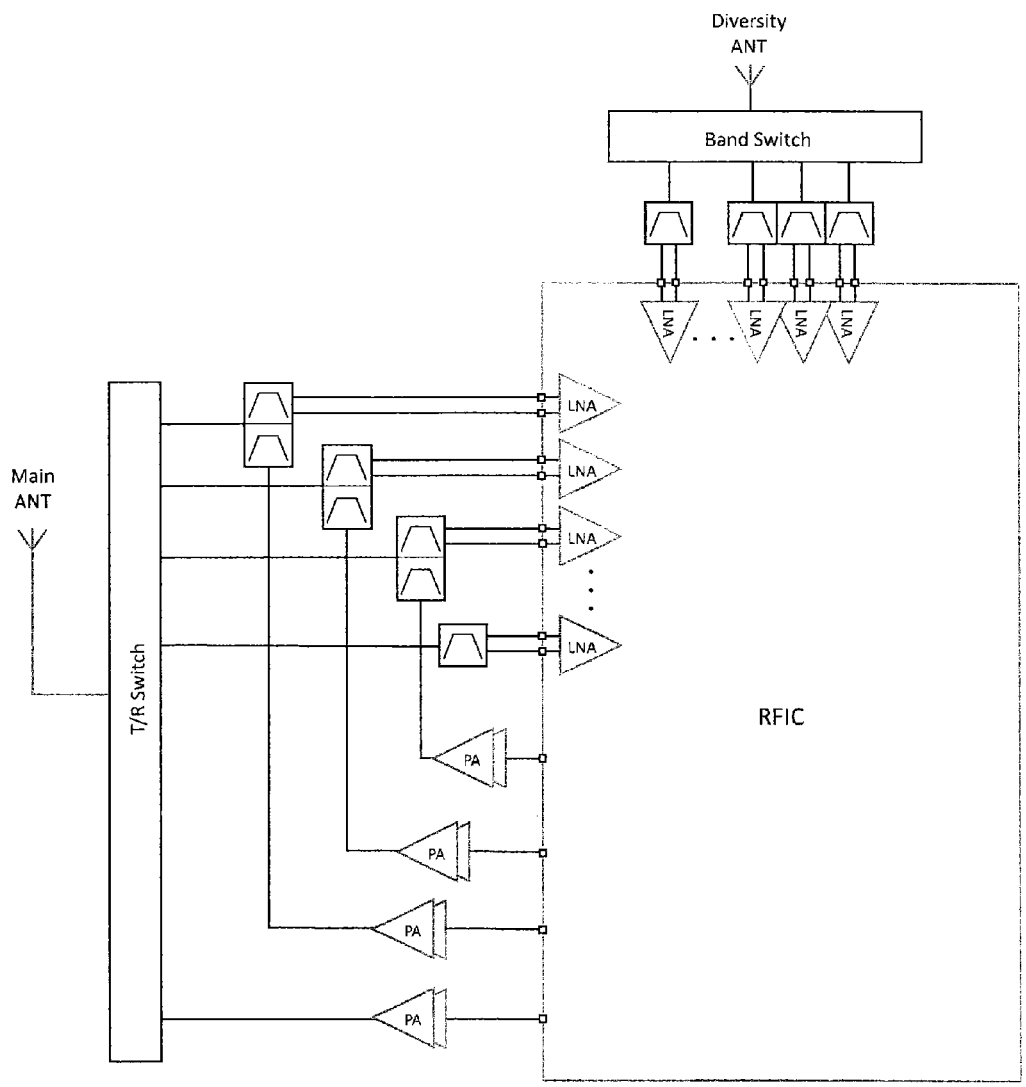
FIG. 1 is an illustration in accordance with the prior art.
Figure 2C:
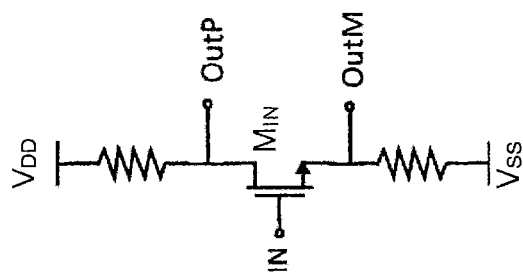
FIGS. 2a-2f illustrate a plurality of single-ended low noise amplifier topologies in accordance with the prior art.
Figure 2B:
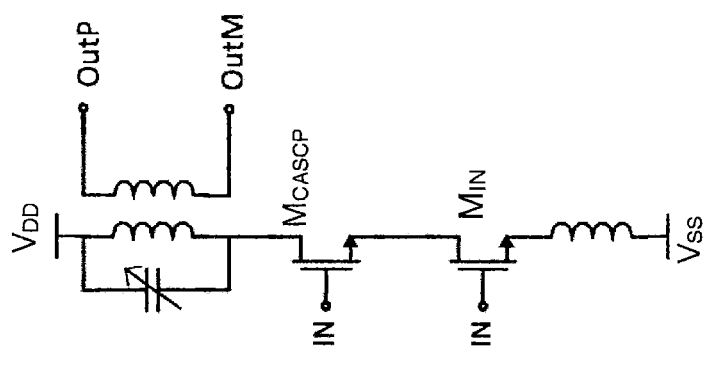
Figure 2A:
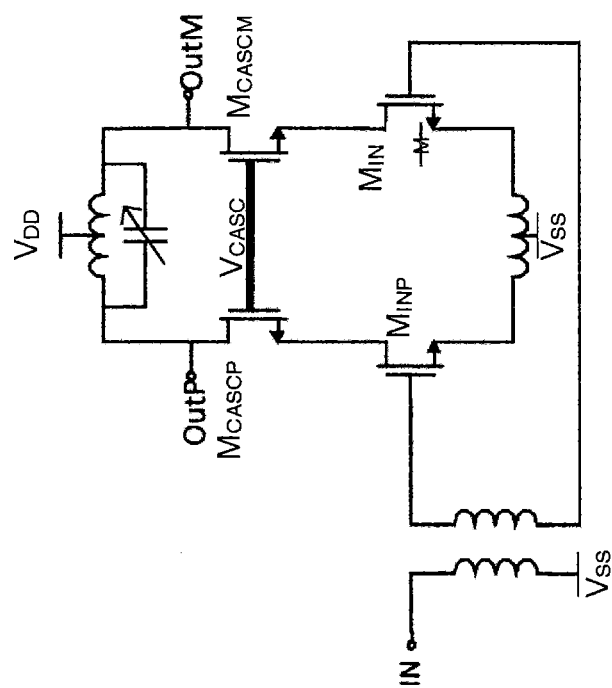
Figure 2F:
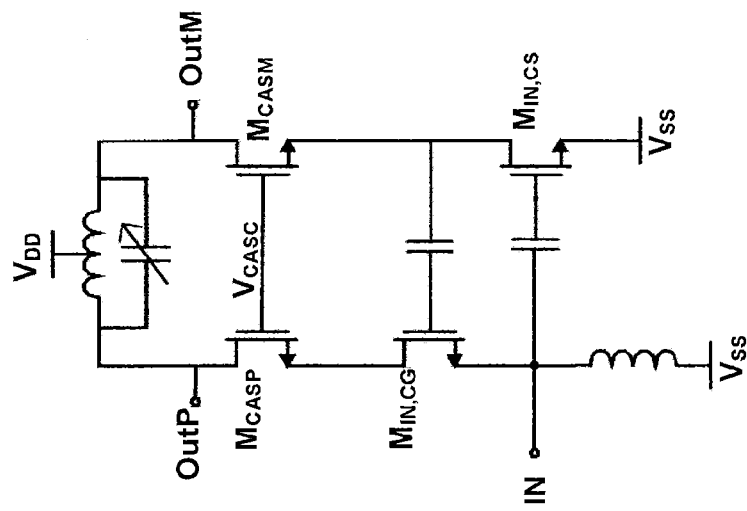
Figure 2E:
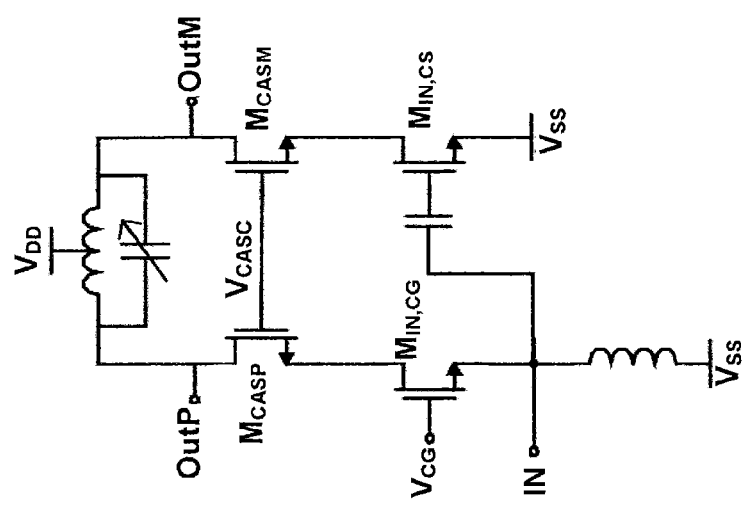
Figure 2D:
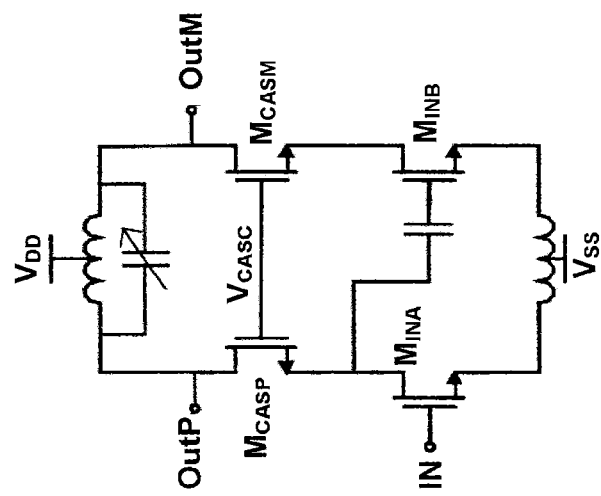

Reference will now be made in detail to the embodiments of the present invention, examples of which are illustrated in the accompanying drawings. In the drawings, the reference signs are maintained so that components having the same reference sign in different figures refer to similar components and are not explained again. A person skilled in the art understands that the components need not to be exactly the same but the parameters may vary.

Figure 3:
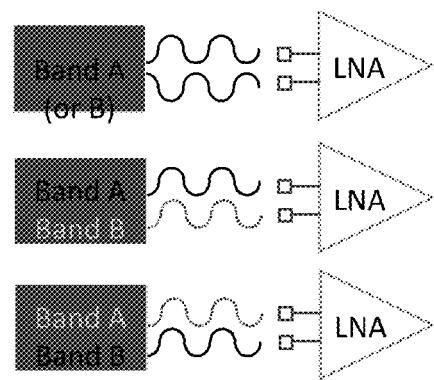
FIG. 3 is an illustration of different operating modes in accordance with embodiments of the present invention.

In FIG. 3, the general principle of the present invention is illustrated. The invention is to implement such a LNA which can adaptively support both single-ended and differential input configurations. Then, depending on the desired use case, the LNA can be configured to support either a single-ended RF-filter/Front-End Module (FEM), or, when the best possible performance against interference is wanted, the LNA input can be fully differential. The selection can be done according to customers' needs and the adaptive RFIC is able to support a variety of use cases. Furthermore, in the single-ended configuration, either of the input pins can be chosen as an active input pin. For example, in a Diversity receiver (which may suffer less from interference from its own transmitter), the inputs could be used in a single-ended operating mode, thus saving several pins. When frequency band combinations are chosen properly, each LNA can be used for two different bands in the single-ended mode; thus, there remain less or no unused pins, which further allows "saving pins", or using the existing pins efficiently. The frequency band combination selection may be done so that, for each LNA, two such frequency bands are never needed at the same time.

In FIG. 3, exemplary use cases are shown. In the uppermost case, the LNA is configured to the differential mode and in this example it is targeted to support a radio frequency band A. The LNA can also support a radio frequency band B when the RF board, matching components etc. are designed properly. Then, in the single-ended configuration, the LNA can be configured to support both radio frequency bands A and B, but only one of those being active at a time. In this example, the other pin is targeted to support the radio frequency band A and the other pin the radio frequency band B.

Figure 4A:
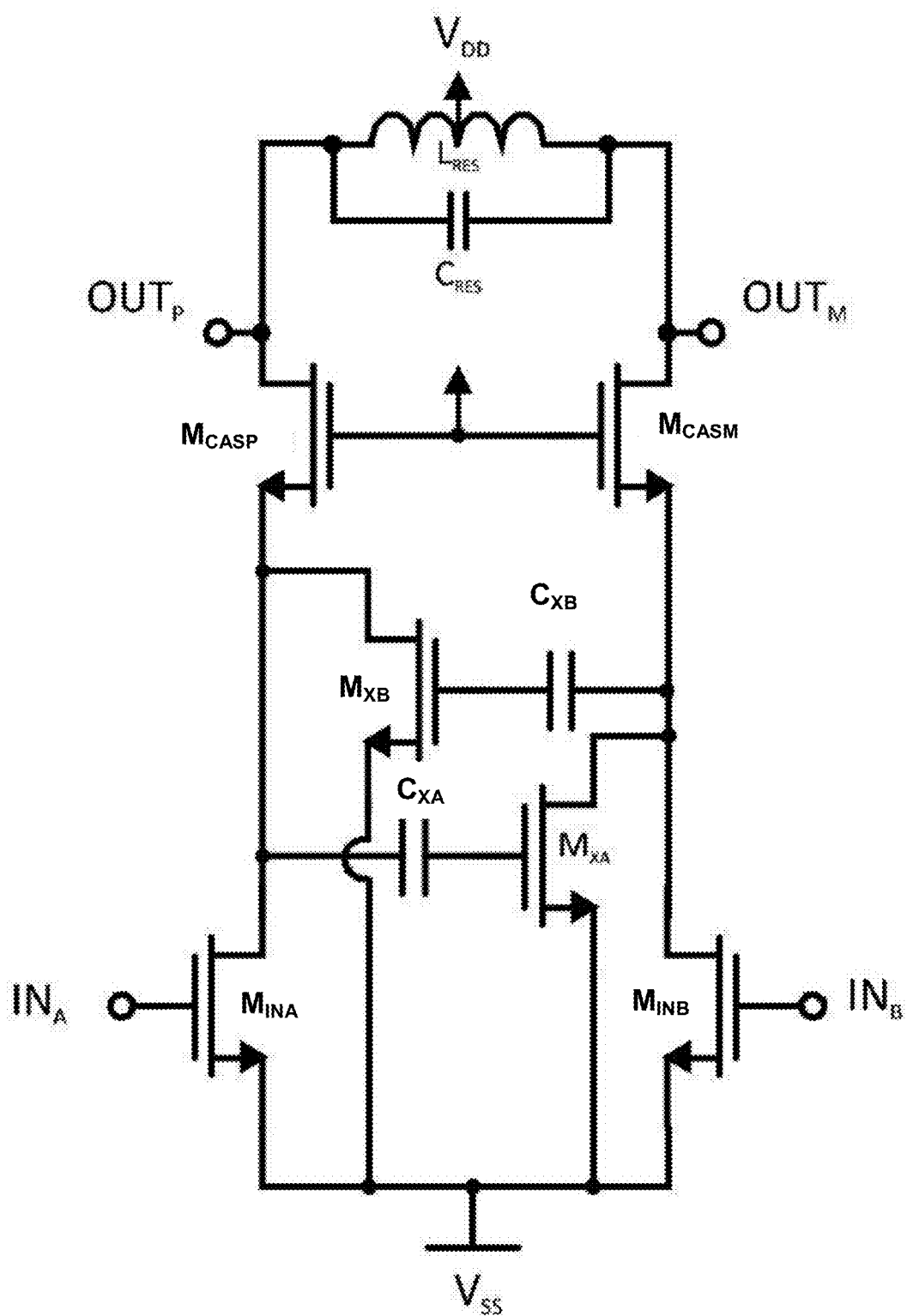
FIGS. 4a-4b illustrate example embodiments in accordance with the present invention.
Figure 4B:
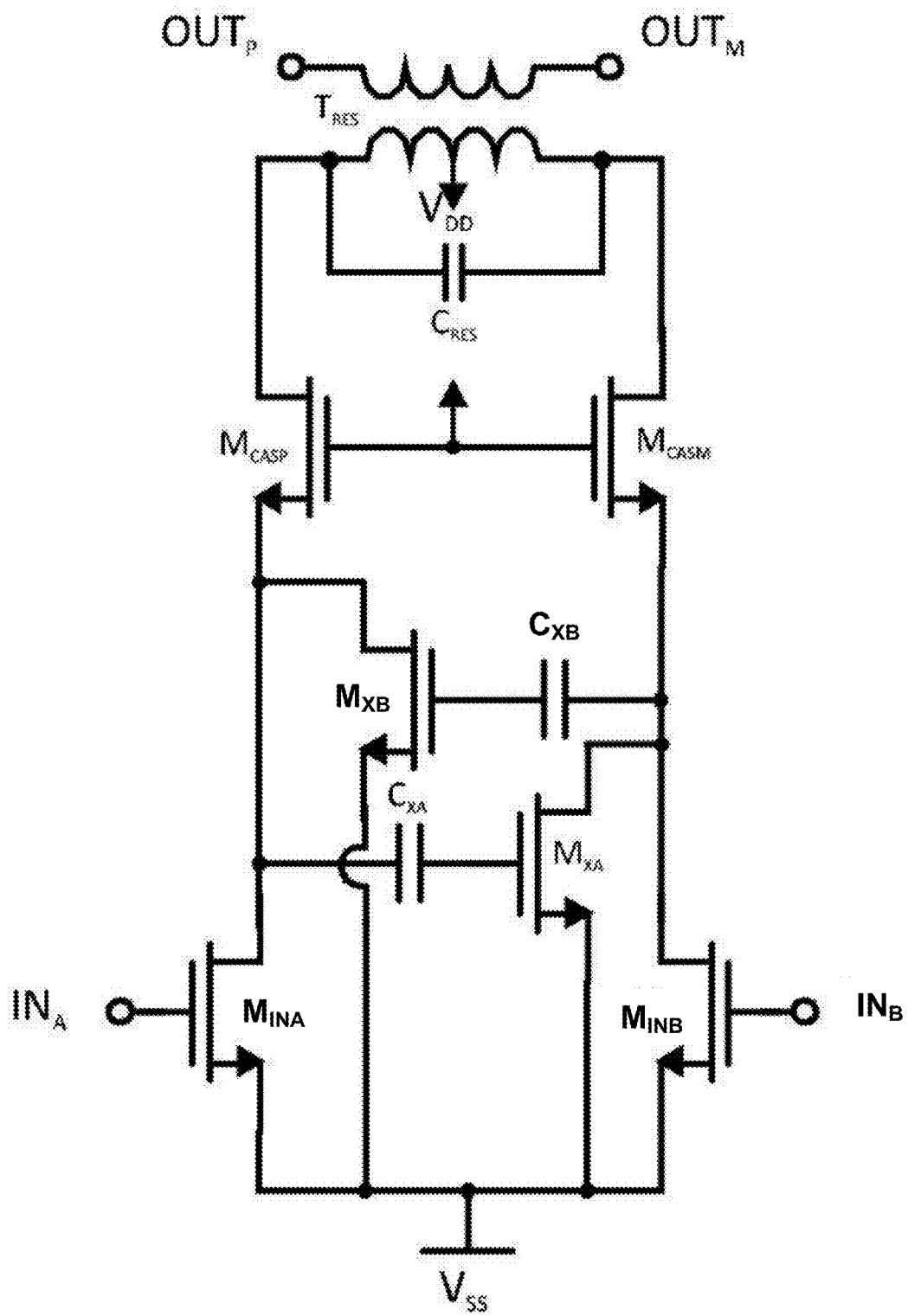

In FIG. 4, an example of an adaptive single-ended/differential low noise amplifier is disclosed. It presents a typical common-source amplifier with a cascode stage. In this example, the means for receiving the input signal are devices $M_{INA}$ and $M_{INB}$, which act as input transistors. An active balun can be created with means for activating that are in the example of FIG. 4 auxiliary transistors $M_{XA}$ or $M_{XB}$ connected to corresponding capacitors $C_{XA}$ and $C_{XB}$. FIG. 4a shows a typical LC-resonator structure for the output. In FIG. 4b, the output is taken from the transformer $T_{RES}$ secondary winding. With this arrangement, the DC level of the output can be set for optimal mixer performance, for example. In the following examples, the LNA structure with a transformer-less design is described. The decision of activating inputs is based on the desired operation. The operating mode may be determined for example by a control signal using a control pin, a memory location, register, configuration information in a printed wiring board, some other component installed in the device or by any other suitable means that can be used for switching the desired operating mode. The operating mode may be determined statically or it can be changed dynamically, for example by using a control signal for setting transistors controlling the operating mode to an open or closed state, corresponding functionally to setting a switch off or on by using switching means. In arrangements of the invention, the first and/or the second switching means comprise switching transistors, each of the switching transistors is configurable in the open state (corresponding to the switch being off) via input of an open state control signal to the input terminal of the respective switching transistor, and each of the switching transistors is configurable in the closed state (corresponding to the switch being on) via input of a closed state control signal to the input terminal of the respective switching transistor. Hence, the topology of the circuit can be conveniently configured by applying appropriate control signals, for example digital control signals, to a number of switching transistors within the circuit. The actual control signal's or control signals' logical and electrical values depend on the used transistor technology. An operating mode indicator is not disclosed in FIG. 4; however, an example is disclosed below with referral to FIG. 8, and a person skilled in the art understands that it can be, for example, a memory or a register of at least two bits, or any other suitable means for setting required transistors. Then, the transistors can be set based on that information. In this example, NMOS transistors are used. Alternatively, PMOS transistors could be used. Then, the input and auxiliary transistors could be connected towards a positive supply, and the resonator load would be connected to the ground node.

Figure 5A:
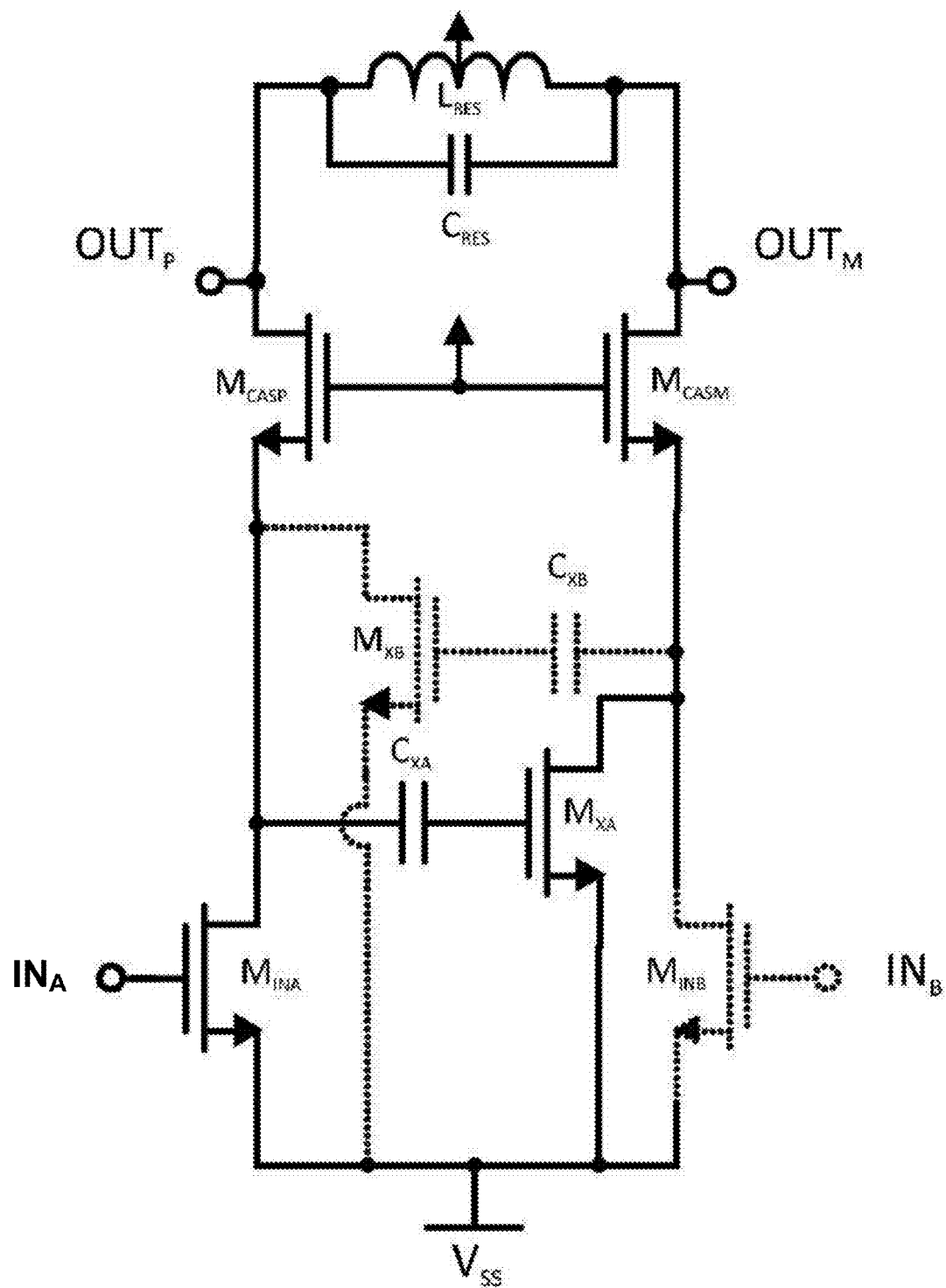
FIGS. 5a-5c illustrate different operating mode configurations of the embodiment of FIG. 4a, FIGS. 6a-6b illustrate embodiments in accordance with the present invention.
Figure 5B:
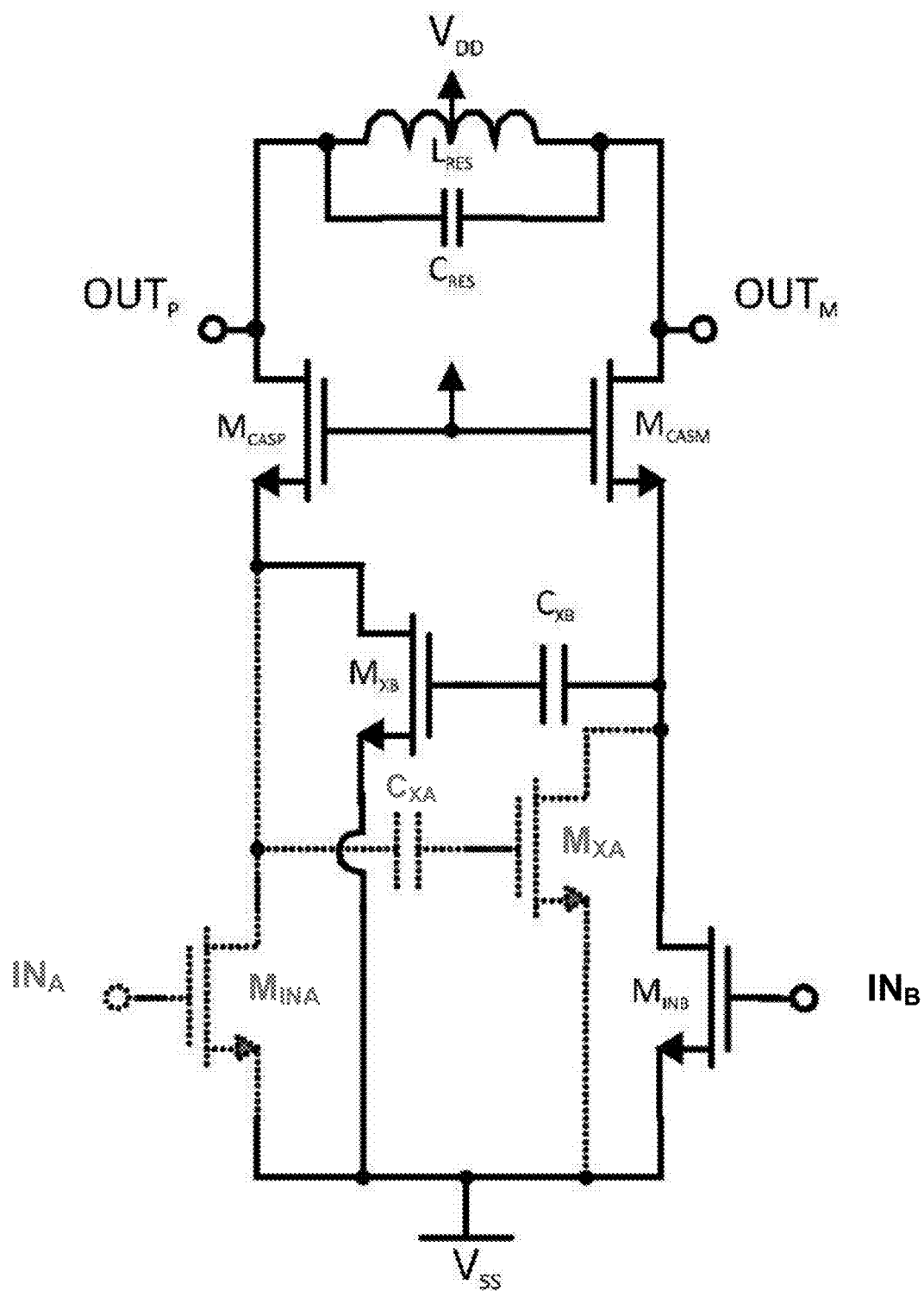
Figure 5C:
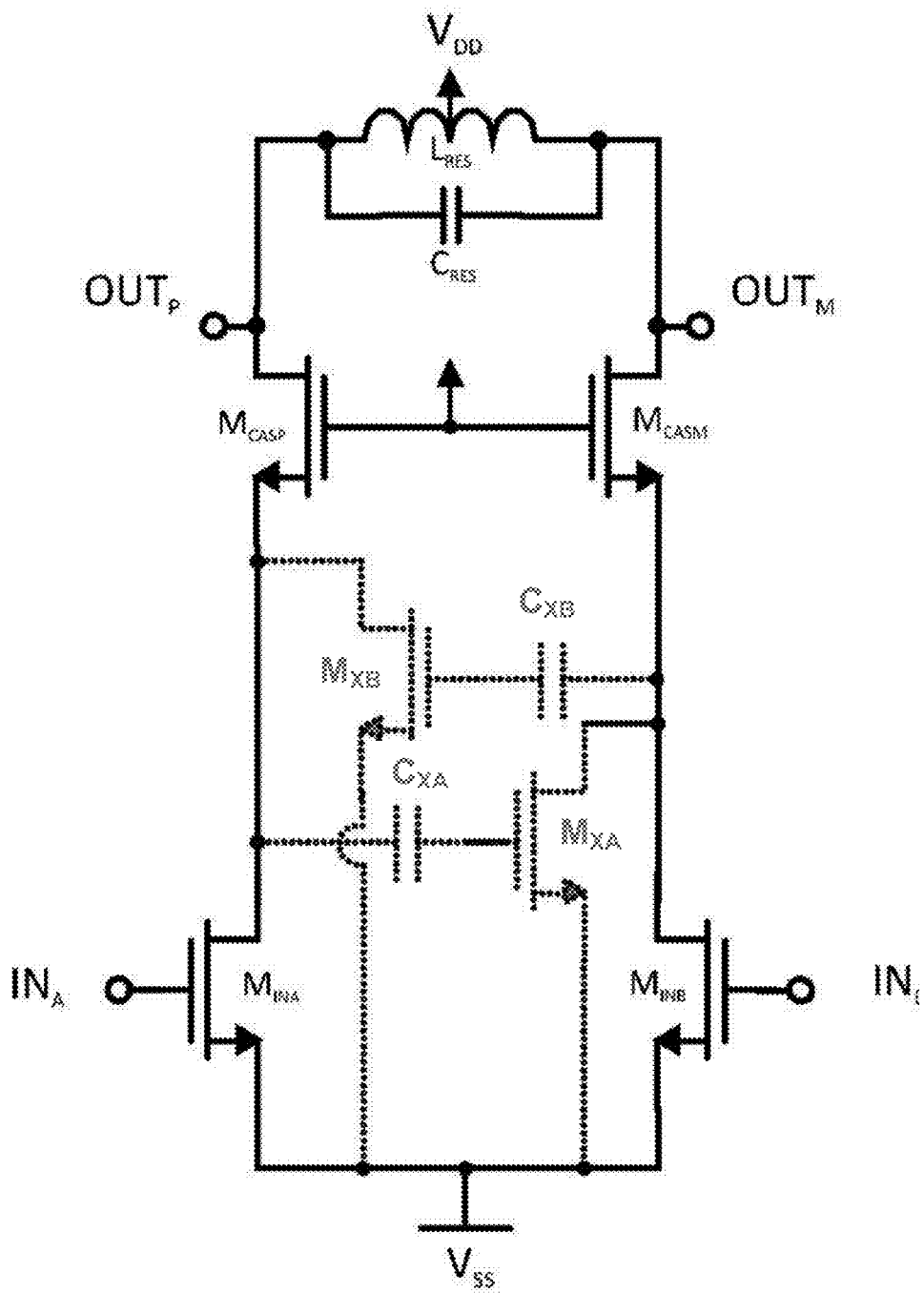

FIGS. 5a-5c illustrate different operating mode configurations of the low noise amplifier of FIG. 4a. Although the operating modes are discussed only regarding the embodiment of FIG. 4a, a person skilled in the art will understand that these principles are applicable, for example, to the embodiment of FIG. 4b. In FIGS. 5a-5c, single-ended or differential configurations are presented. Inactive portions of the circuit are depicted with a dotted line. For example, when the LNA is configured as a differential amplifier in FIG. 5c, both $M_{INA}$ and $M_{INB}$ are activated and $M_{XA}$ or $M_{XB}$ are off. If the LNA is configured to support the single-ended input, either input A or B can be used. For example, when in FIG. 5a input A is used, $M_{INA}$ and $M_{XA}$ are active, $M_{INB}$ and $M_{XB}$ inactive. Correspondingly, when input B is used, $M_{INA}$ and $M_{XA}$ are inactive, $M_{INB}$ and $M_{XB}$ active. Cascode devices $M_{CASCP}$ and $M_{CASCM}$ are active in both single-ended and Diff cases. These Figures show only exemplary cases without relation to any matching topology, which is explained in more detail later.

Figure 6A:
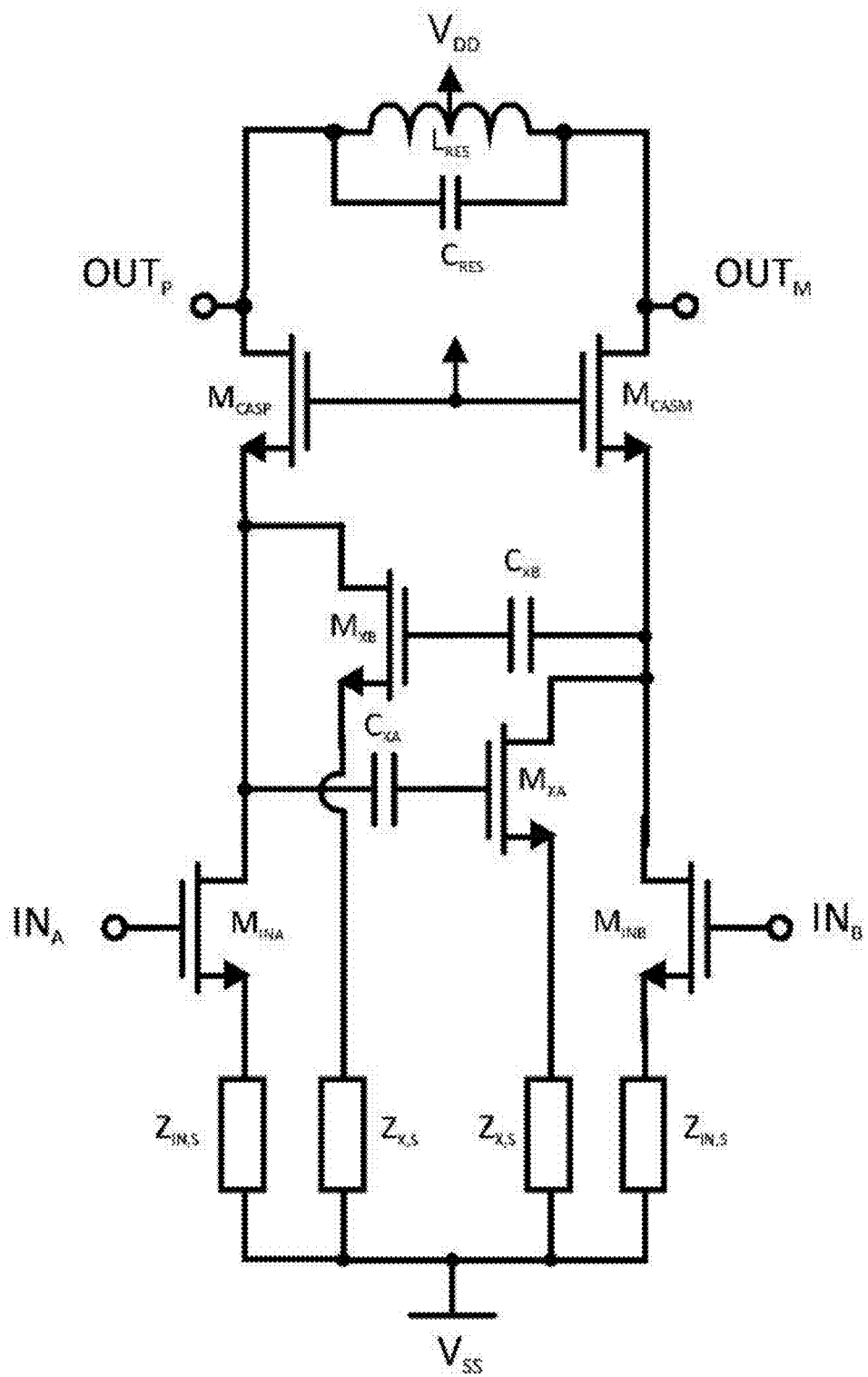
Figure 6B:
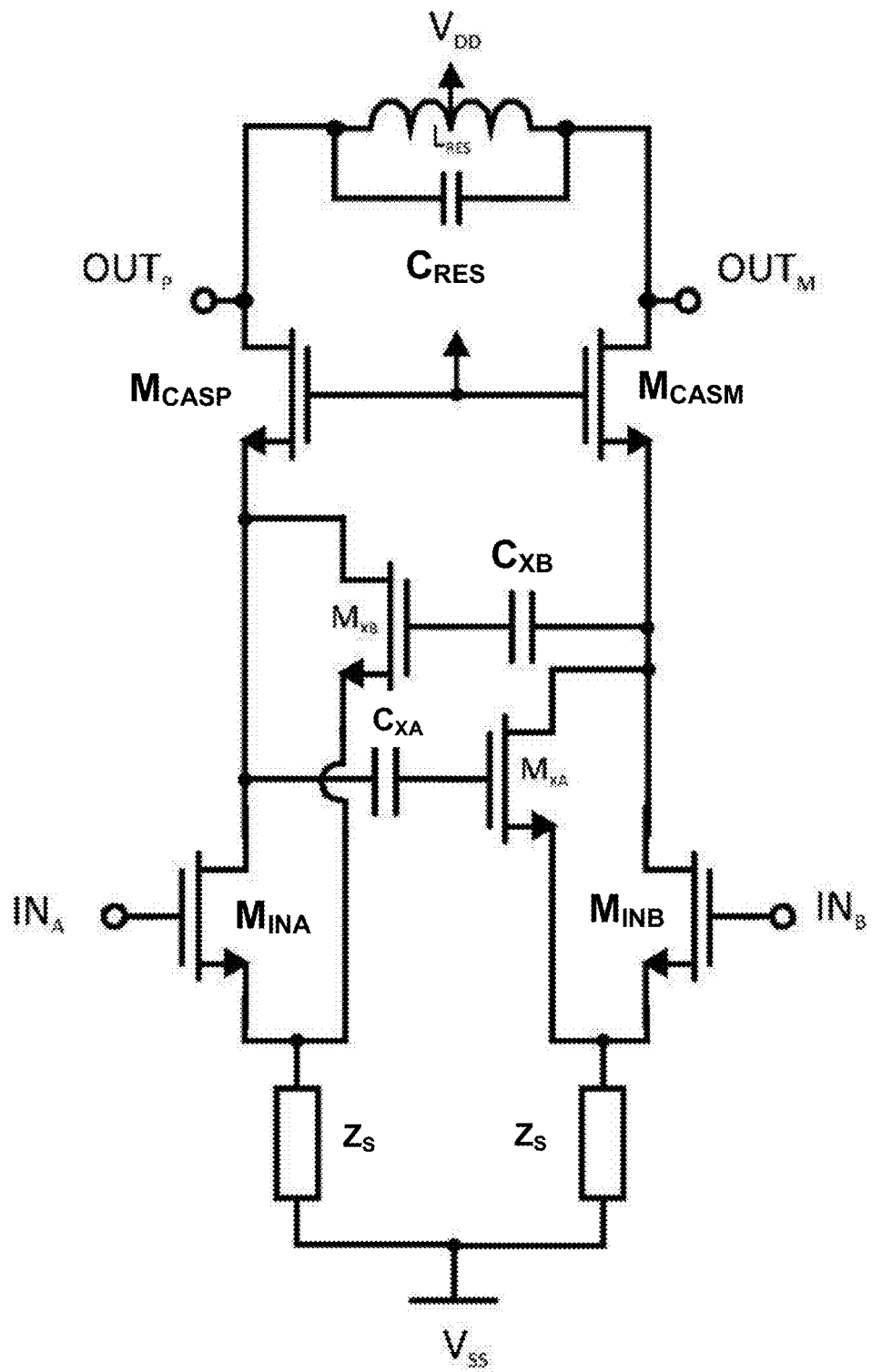

FIG. 6a shows an example where the sources of transistors $M_{INA}$ and $M_{XA}$ are equipped with means for matching impedance, such as general impedances $Z_{IN,S}$ and $Z_{X,S}$, respectively, towards a low-impedance node. Depending on the selected transistor technology used, this low-impedance node may be ground, or a high or low operating voltage. Similarly, sources of transistors $M_{INB}$ and $M_{XB}$ are equipped with means for matching impedance, such as general impedances $Z_{IN,S}$ and $Z_{X,S}$. These impedances need not to be same but may be chosen according to the need. Source nodes can be also connected together as shown in FIG. 6b. Then, the source impedance $Z_S$ is common for $M_{IN}$ and $M_X$. Depending on the input matching topology, desired use case, performance optimization and other desired characteristics, source impedances $Z_{IN,S}$, $Z_{X,S}$ and $Z_S$ can comprise resistance, inductance, mutual inductance or zero impedance.

Figure 7A:
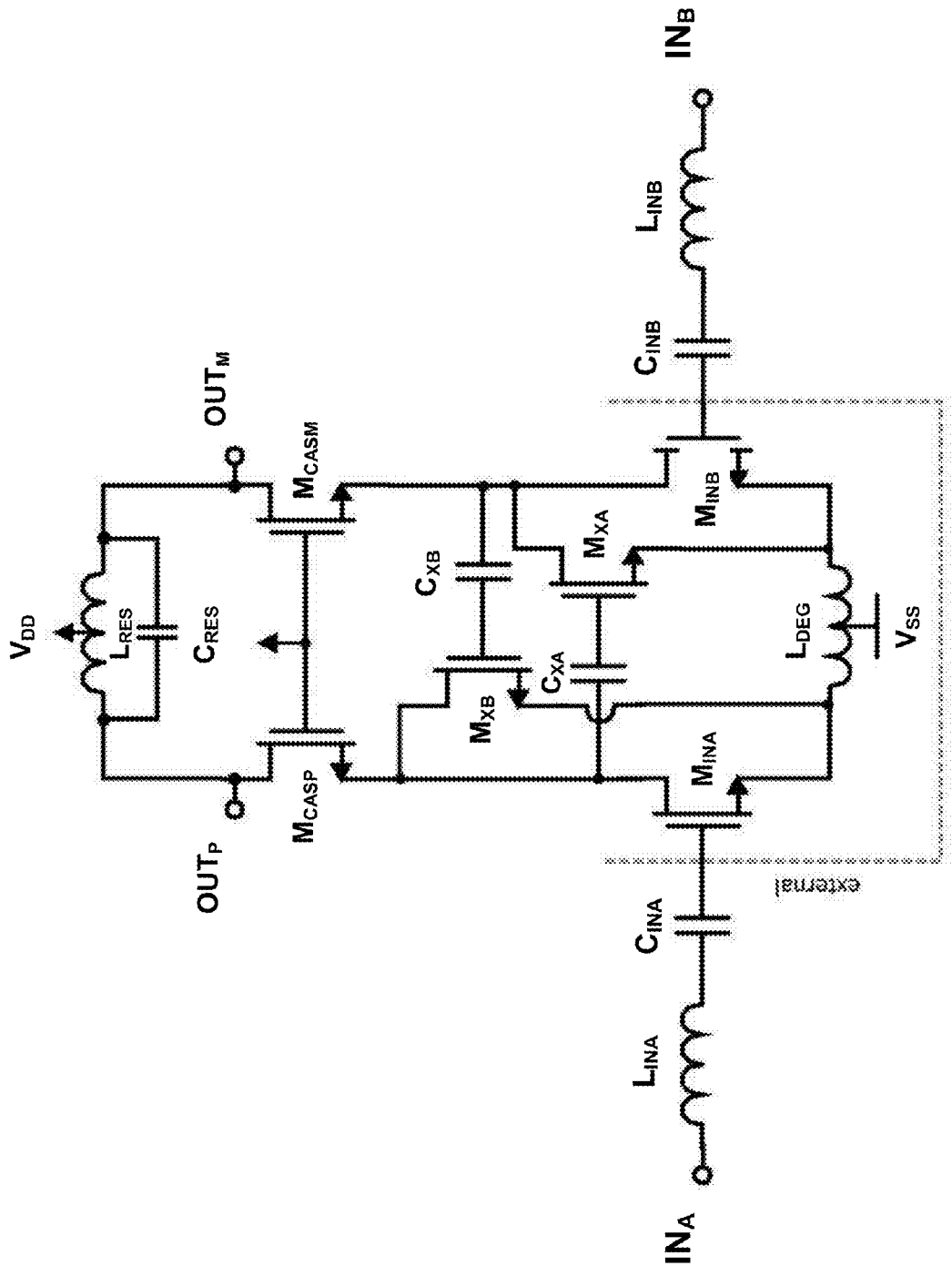
FIGS. 7a-7b illustrate yet another embodiment of the invention and use of it in accordance with the present invention.
Figure 7B:
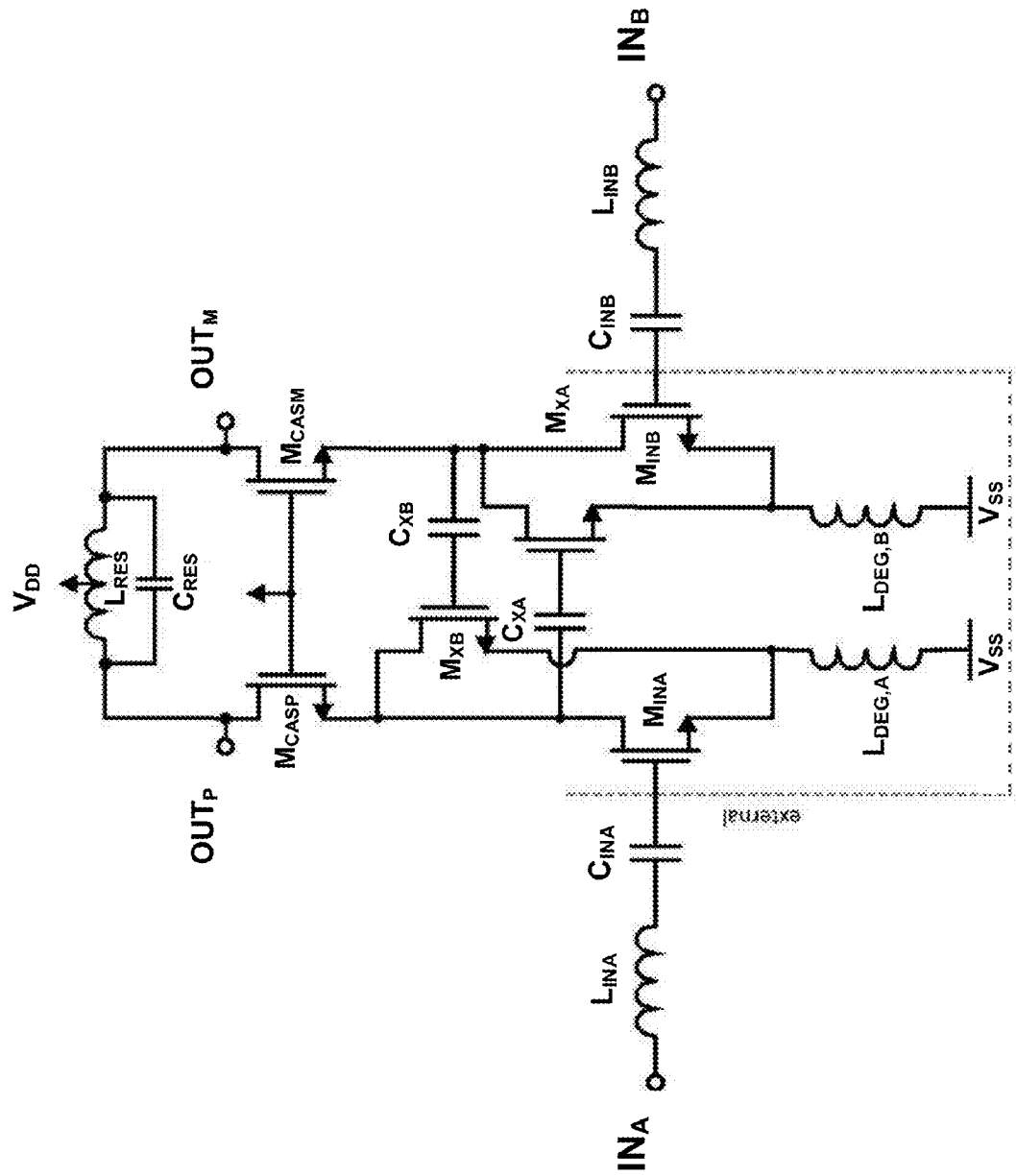

FIG. 7a discloses an adaptive low noise amplifier comprising $L_{DEG}$ input matching topology with means for degenerating a differential source. A differential source degeneration inductor $L_{DEG}$ is connected to input devices such that $M_{INA}$ and $M_{XB}$ share one $L_{DEG}$ input and $M_{INB}$ and $M_{XA}$ the other. On the other hand, the $L_{DEG}$ is connected to a low-impedance node, which may comprise ground, or a high or low operating voltage, depending on the selected transistor technology. FIG. 7b discloses a modification of the embodiment of FIG. 7a. In FIG. 7b, the matching topology is split into $L_{DEG,A}$ and $L_{DEG,B}$.

In a single-ended configuration, input devices are set active as described above with referral to FIG. 5. The mutual inductance of $L_{RES}$ helps generate output currents which have a more differential nature. It is noted that $M_{IN}$ and $M_X$ can be biased differently; the dynamic range vs. current consumption can be optimized by biasing $M_{IN}$ to have a larger current than $M_X$. Although the coarse balancing done by input devices is not perfect, the mutual inductance of LRES forces the voltage at output modes to have a good balance and accurate phase difference.

The values of external matching components $L_{INA}$ and $C_{INA}$ are chosen such that the input matching condition at input A is achieved. In addition to the LC type circuitry, several other design alternatives may be used for implementing the external matching. Similarly, the values of external matching components $L_{INB}$ and $C_{INB}$ are chosen such that the input matching condition at input B is achieved. As noted earlier, inputs A and B can be matched to different radio frequency bands. Then, $L_{INA}$ and $L_{INB}$ might have different values, as might also $C_{INA}$ and $C_{INB}$. Also, the source degeneration coil can be a center-tapped design, i.e. having a varying inductance value. As a result, matching conditions for inputs A and B can be set rather independently. From the isolation point of view, it would be safe to choose supported radio frequency bands such that the uplink (transmitter) frequency of the "non-active" LNA input does not overlap with the reception frequency of the active LNA.

Figures 8A, 8B:
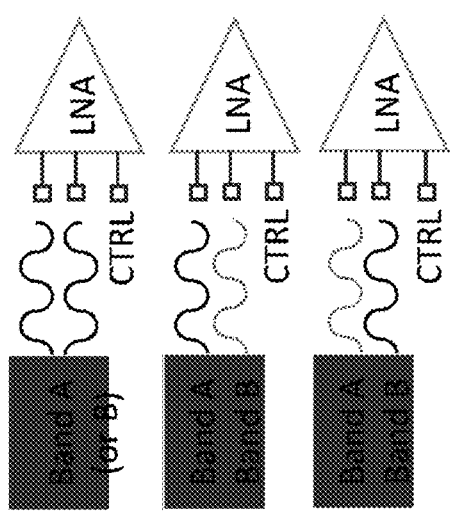
FIGS. 8a-8c illustrate yet another embodiment of the invention.
Figure 8C:
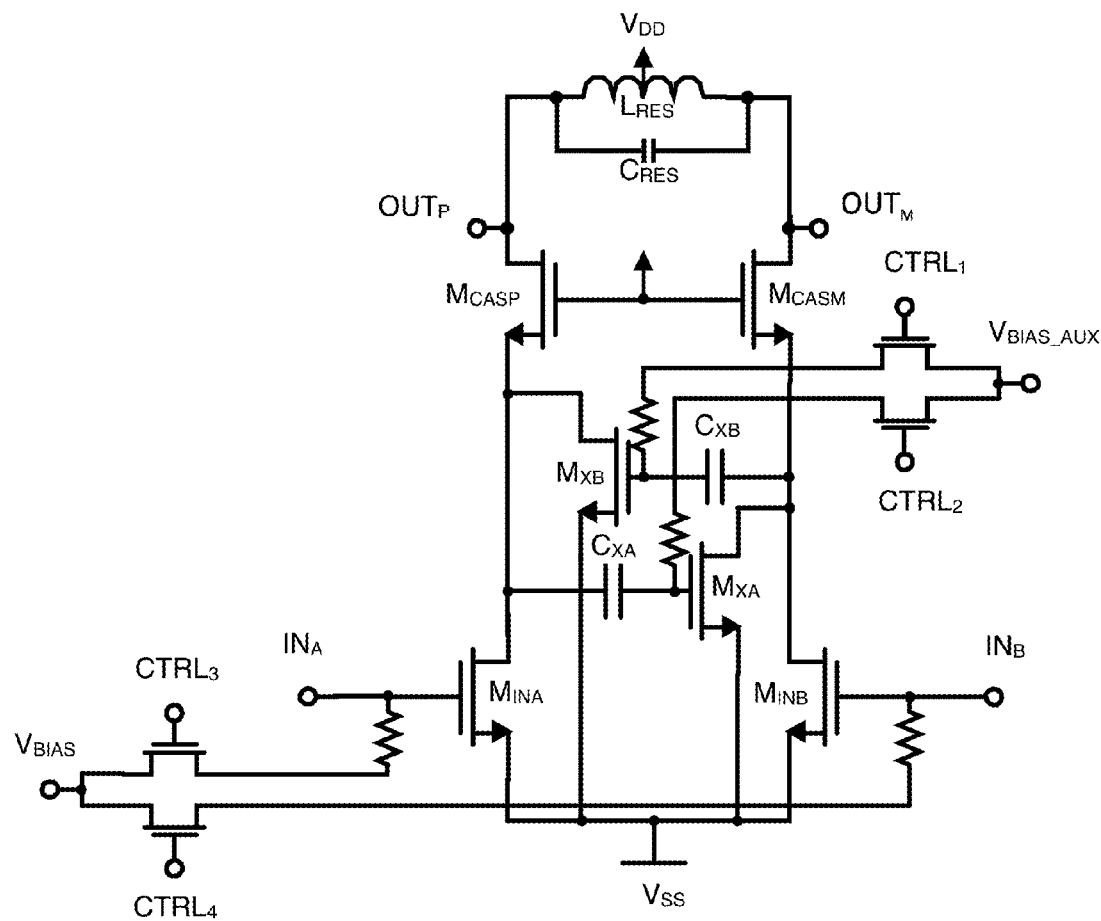

FIGS. 8a-8c illustrate embodiments including exemplary implementations of the biasing and operating mode selection. In FIG. 8a, a modification of FIG. 3 is presented. In the figure, a CTRL-pin is used as an example of the operating mode indicator. The CTRL-pin is used for receiving a control signal. In FIG. 8b, an example configuration table is shown. The table is used, for example, in a configuration according to FIG. 8c. FIG. 8c involves inputs $V_{BIAS}$ and $V_{BIAS\_AUX}$ for providing a biasing voltage and inputs $CTRL_{1-4}$ for indicating the operating mode. As explained above referring to FIG. 4, the control signal enables a switch that enables setting of the operating mode of the transistor on or off.

Figure 9:
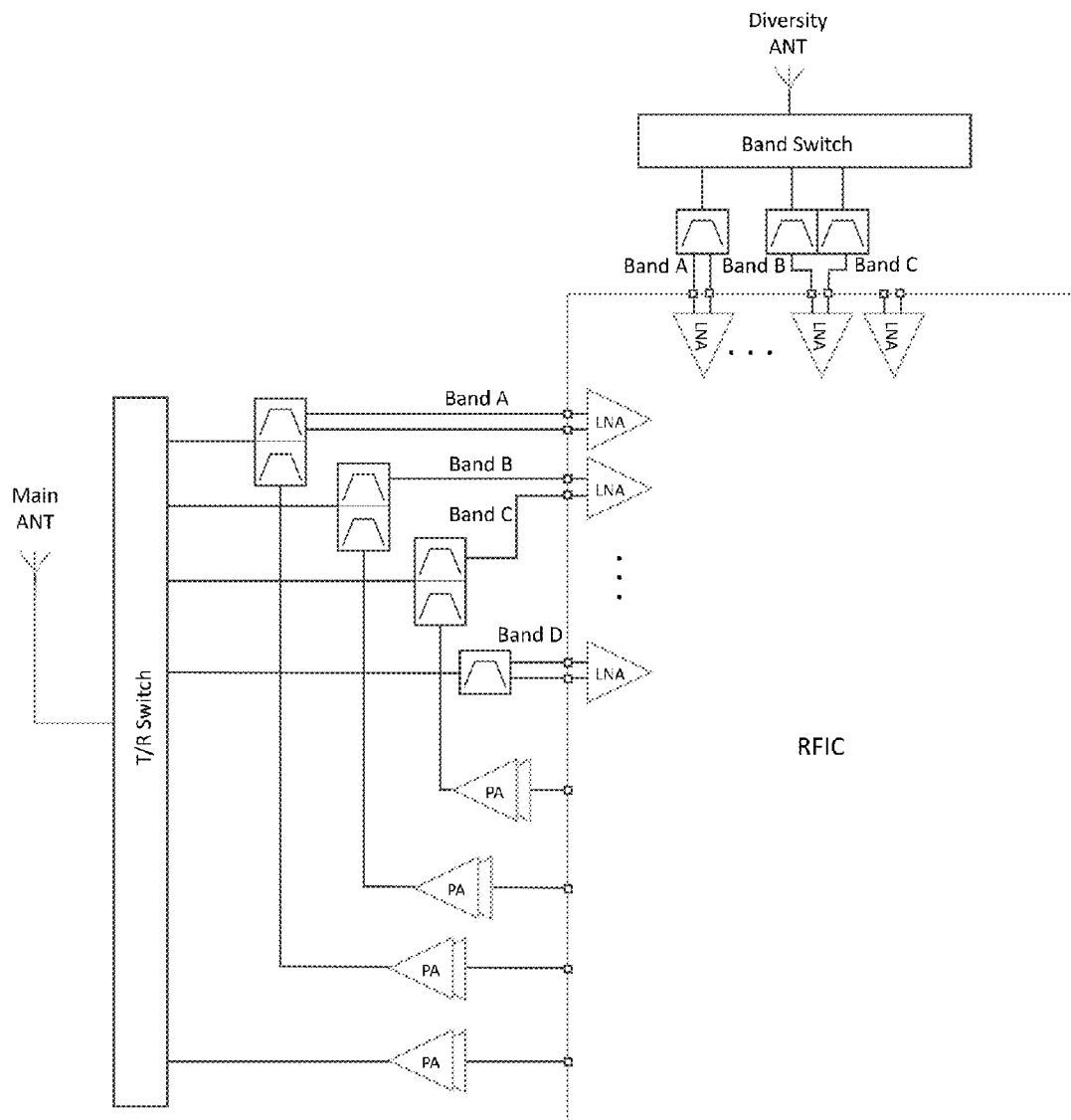
FIG. 9 illustrates exemplary use of the low noise amplifier in accordance with the present invention in an RF-platform.

On the radio frequency platform level, the new low noise amplifier can be used in many different ways. An example is shown in FIG. 9, wherein radio frequency bands A, B and C require a Diversity receiver, but D does not. The designer of the device wants to reach the best possible sensitivity level with radio frequency band A. Therefore, radio frequency band A is supported with a differentially configured low noise amplifier in both Main and Diversity receiver branches. However, to save some pins, radio frequency bands B and C may be "combined" into the same low noise amplifier in both Main and Diversity receiver sides. Also, radio frequency band D was seen to be an important one, and good reference sensitivity is needed to fulfill customers' requirements. Although the radio frequency band D receiver input is not coupled with its own transmitter via a duplexer, during verification testing it was seen to be sensitive to other interference generated on-chip. Therefore, the differential low noise amplifier configuration offered better sensitivity performance and it may be chosen in a final product.

It should be noted that the term "connected to" may indicate either a direct connection between two parts, or any number of intermediate components may be connected between the parts.

In the description above, a low noise amplifier with two inputs has been discussed. It is obvious to a person skilled in the art that the same principles may be applied to low noise amplifiers with more inputs, such as three or four input pins. Such low noise amplifiers can support more operating modes, wherein the operating mode is chosen according to the current need.

Typically, the invention is used in a mobile phone, mobile communication device, data communication devices, satellite-based positioning system devices, tablets, portable computers and similar devices that are connected to radio communication networks.

It is obvious to a person skilled in the art that, with the advancement of technology, the basic idea of the invention may be implemented in various ways. The invention and its embodiments are thus not limited to the examples described above; instead, they may vary within the scope of the claims.

What is claimed is:

1. An apparatus comprising:
    a first input; and
    a second input, wherein
    the apparatus is configured to selectively operate in each of a plurality of operating modes, the operating modes including a first mode in which the first input is active in a single-ended mode configured to receive a first radio frequency band, a second mode in which the second input is active in a single-ended mode configured to receive a second radio frequency band, and a third mode in which the first and second inputs are active in a differential mode configured to receive one of the first radio frequency band or the second radio frequency band.

2. The apparatus according to claim 1, further comprising:
    circuitry configured to obtain an operating mode indicator indicating one of the plurality of operating modes from an external device.

3. The apparatus according to claim 1, wherein one of the plurality of operating modes is indicated in the form of a control signal.

4. The apparatus according to claim 1, further comprising:
    a first input transistor coupled to the first input; and
    a second input transistor coupled to the second input.

5. The apparatus according to claim 4, further comprising:
    a first and second auxiliary transistor with their gates connected to the outputs of the first and second input transistors, respectively, and configured to create an active balun in accordance with a selected operating mode.

6. The apparatus according to claim 5, further comprising:
    a first and a second capacitor, wherein the first capacitor is connected between an output of the first input transistor and the gate of the first auxiliary transistor and the second capacitor is connected between an output of the second input transistor and the gate of the second auxiliary transistor.

7. The apparatus according to claim 5, wherein
    each of the first and second input transistors and first and second auxiliary transistors are connected to general impedances towards a low-impedance node.

8. The apparatus according to claim 5, wherein
    the first input transistor and the second auxiliary transistor are connected to a first common impedance towards a low-impedance node and the second input transistor and the first auxiliary transistor are connected to a second common impedance towards a low-impedance node.

9. The apparatus according to claim 7, wherein
    the low-impedance node comprises a ground or a voltage supply node.

10. The apparatus according to claim 5, further comprising:
    a degeneration inductor, wherein an output of the first input transistor and an output of the second auxiliary transistor are connected to a first input of the degeneration inductor and an output of the second input transistor and an output of the first auxiliary transistor are connected to a second input of the degeneration inductor.

11. The apparatus according to claim 5, further comprising:
    a first degeneration inductor, wherein an output of the first input transistor and an output of the second auxiliary transistor are connected to the first degeneration inductor and a second degeneration inductor, wherein an output of the second input transistor and an output of the first auxiliary transistor are connected to the second degeneration inductor.

12. The apparatus according to claim 1, further comprising:
   at least one pin configured to receive at least one control signal for indicating one of the plurality of operating modes.

13. The apparatus according to claim 1, wherein
   the apparatus is one of a low noise amplifier or a low noise transconductance amplifier.

14. An apparatus for radio frequency devices, wherein the apparatus comprises at least one apparatus according to claim 1.

15. The apparatus according to claim 14, further comprising:
   external matching components connected to the first and the second inputs, respectively.

16. The apparatus according to claim 14, wherein the apparatus is a radio frequency integrated circuit.

17. The apparatus according to claim 1, wherein
   the apparatus is one of the following: a mobile phone, a mobile communication device, a local connectivity device, a satellite-based positioning system device, a tablet or a computer.

18. An apparatus comprising:
   a first input;
   a second input, wherein
   the apparatus is configured to selectively operate in each of a plurality of operating modes, the operating modes including a first mode in which the first input is active in a single-ended mode configured to receive a first radio frequency band, a second mode in which the second input is active in a single-ended mode configured to receive a second radio frequency band, and a third mode in which the first and second inputs are active in a differential mode configured to receive one of the first radio frequency band or the second radio frequency band; and
   a memory configured to store an indication of a selected operating mode.

19. An apparatus comprising:
   a first input;
   a second input, wherein
   the apparatus is configured to selectively operate in each of a plurality of operating modes, the operating modes including a first mode in which the first input is active in a single-ended mode configured to receive a first radio frequency band, a second mode in which the second input is active in a single-ended mode configured to receive a second radio frequency band, a third mode in which the first and second inputs are active in a differential mode configured to receive one of the first radio frequency band or the second radio frequency band, and a fourth mode in which the first input and the second input are inactive.

* * * * *